United States Patent [19]

Orcutt et al.

[11] Patent Number: 5,330,089
[45] Date of Patent: Jul. 19, 1994

[54] POLAR BOND HEAD

[75] Inventors: John W. Orcutt; Galle Lin, both of Richardson, Tex.

[73] Assignee: Texas Instruments Incorporated, Dallas, Tex.

[21] Appl. No.: 983,092

[22] Filed: Nov. 23, 1992

Related U.S. Application Data

[63] Continuation of Ser. No. 691,944, Apr. 26, 1991, abandoned.

[51] Int. Cl.5 ................................................. B23K 1/06
[52] U.S. Cl. .................................. 228/1.1; 228/45; 318/135; 318/38
[58] Field of Search ............... 228/4.5, 1.1, 45; 901/338; 74/479; 310/12; 318/37, 38, 135, 35

[56] References Cited

U.S. PATENT DOCUMENTS

| | | | |
|---|---|---|---|
| 4,445,633 | 5/1984 | Bonham | 228/4.5 |
| 4,507,597 | 3/1985 | Trost | 318/38 |
| 4,550,871 | 11/1985 | Chan et al. | 228/4.5 |
| 4,610,387 | 9/1986 | Scavino | 228/1.1 |
| 4,808,892 | 2/1989 | Dreibelbis | 318/135 |
| 5,060,841 | 10/1991 | Oshima | 228/4.5 |
| 5,078,312 | 1/1992 | Ohashi et al. | 228/1.1 |
| 5,169,050 | 12/1992 | Montagu | 28/4.5 |

FOREIGN PATENT DOCUMENTS

| | | | |
|---|---|---|---|
| 0184734 | 10/1983 | Japan | 228/4.5 |
| 0163648 | 7/1986 | Japan | 228/4.5 |
| 0201434 | 9/1986 | Japan | 228/4.5 |
| 0021234 | 1/1987 | Japan | 228/4.5 |
| 0598751 | 3/1978 | U.S.S.R. | 228/45 |

Primary Examiner—Paula A. Bradley
Assistant Examiner—James Miner
Attorney, Agent, or Firm—Wade James Brady; Richard L. Donaldson

[57] ABSTRACT

A polar motion bond head for bonding semiconductor devices includes voice coil motors for providing positioning motion to the bond head, and a vision system that has an optical path that allows the camera to see all polar positions with the image staying on the camera centerline.

25 Claims, 4 Drawing Sheets

POLAR BOND HEAD

This application is a continuation of application Ser. No. 691,944, filed Apr. 26, 1991, now abandoned.

FIELD OF THE INVENTION

This invention relates to wire bonders used in the manufacture of semiconductor devices, and more particularly to a wire bonder having a polar motion bond head.

BACKGROUND OF THE INVENTION

Conventional semiconductor wire bonders use X-Y tables to move the bond head over the semiconductor device for bonding lead wires between the semiconductor device and its leadframe fingers. Sometimes the leadframe is replaced by other appropriate electrical connections such as a ceramic package, hybrid circuit, or other semiconductor device. The X-Y coordinate tables are driven by complex mechanical components that convert the rotary motion of the axis drive motor to controlled linear motion. Typical mechanical components may include lead screws, ball nuts, encoders, shaft and thrust bearings, and couplings, all of which reduce mechanical reliability. The bond head moved by conventional X-Y coordinate tables, carries several components such as a Z-axis drive motor, a camera for vision functions, and other components required to bond the lead wires. Such components add weight to the moving bond head, reducing maximum available table acceleration, and induce vibrations on stopping, which also increases bonding time and limits the bonder productivity. Conventional bond heads also employ flex pivots, shaft and bearings, or other point flex mechanisms to produce Z-axis motion through an arc which only allows the bond tool to be square to the bonding surfaces at only one bonding height. This inability to be square at all bonding heights causes bonding problems as the die and lead fingers are usually at different heights due to product requirements, which is further complicated by thickness variations of die, die bond material and the leadframe.

In other bonders, the X-Y table may be driven by linear motors or voice coil motors. Voice coil motors simplify gearing required by other motor drives, and eliminates ball-screw drives and slides used on some conventional X-Y tables.

BRIEF SUMMARY OF THE INVENTION

The invention is a wire bond machine for, but not limited to, semiconductor devices where the conventional X-Y coordinate bond head table is replaced by a polar coordinate table that is driven directly with a fixed field magnet, linear voice coil actuators, to reduce mechanical components for better reliability. The bond tool is always perpendicular to the bonding surface which improves bonding consistency. The Z-axis motor is either partially or totally fixed, and not carried by the polar table. A vision function camera is located in a fixed position, reducing mass carried by the polar coordinate table and produces minimum settling time and maximum acceleration of the bond head.

The wire bond head is moved linearly by a first voice coil actuator, and through an angle actuated by a second voice coil actuator. The bond head is mounted on a shaft that may include an air bearing such that when the first voice coil is energized, the bond head frame moves linearly, its speed and direction of movement controlled by the voice coil current and polarity. The bond head frame pivots around a fixed point. The pivot member is a flexible piece of spring steel or bearing system. Sensors measure the angular and linear motion of the bondhead table which feed polar table positions to a control computer that drives the voice coil actuators. The bonding locations on the semiconductor device and lead frame which are normally registered by rectangular coordinates, found in polar coordinates by $x=(R+\Delta R)\cosine \theta$ and $Y=(R+\delta R)\tangent \theta$. The bond head is moved vertically, in the Z-direction by a third voice coil motor.

A camera or vision apparatus is mounted at the pivot point of the bond head frame and "views" the bonding area through lenses and 45 degree mirror prisms.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
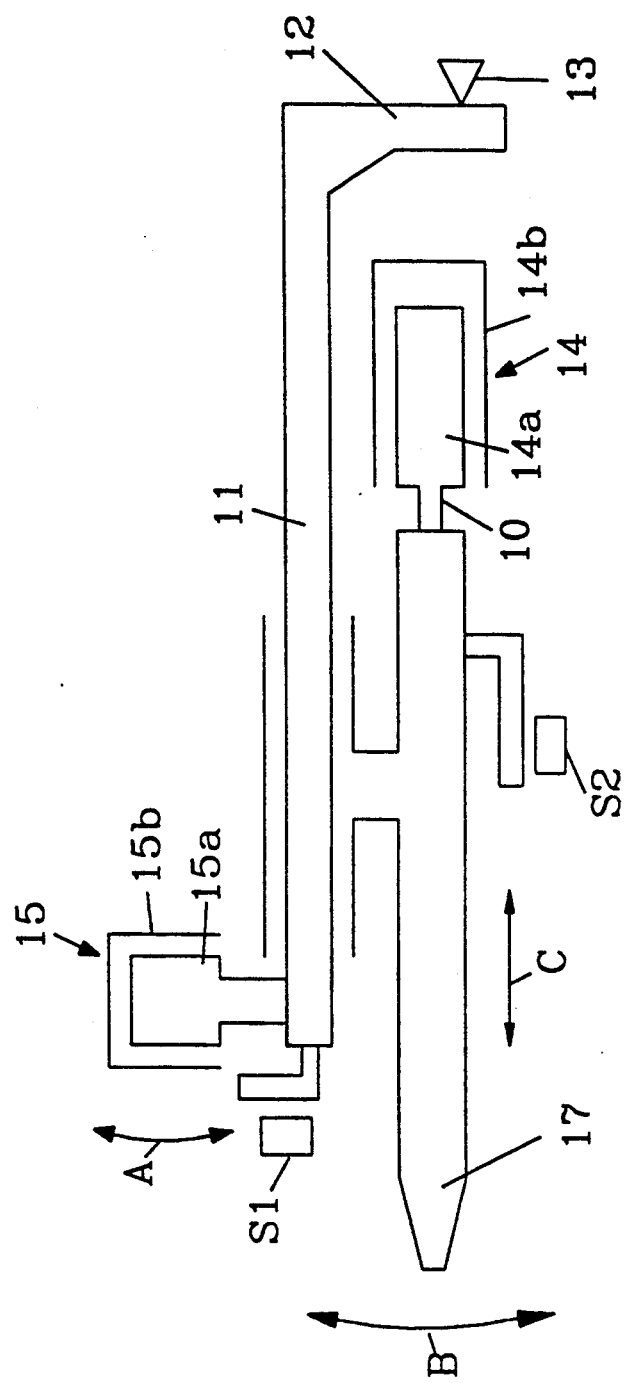
FIG. 1 is a simplified illustration of the polar table portion of the invention.

FIG. 1 is a simplified illustration of the polar portion of the invention. The radius portion of the polar motion is provided by linear motor 14 which has its field magnet 14b fixed in place, and its movable coil 14a attached to table rod 10. Current flowing through coils 14a will react with field magnet 14b, driving coil 14a and table rod 10 back and forth on theta rod 11, as indicated by arrow "C", producing the radius portion of a polar coordinate motion.

The angular or theta portion of the polar motion is provided by linear motor 15, which has its field magnet 15b, fixed in place, and movable coil 15a, attached to theta rod 11. Theta rod 11 is attached to pivot 13 by mount 12. Current flow through coil 15a will react with field magnet 15b, moving coil 15a as indicated by arrow "A", driving theta rod 11 and bond head cone 17 about pivot 13, as indicated by arrow "B", producing the theta portion of a polar coordinate motion. Motion of the radius and theta portions of the polar coordinate motions are monitored by sensors $S_2$ and $S_1$, respectively.

The radius dimension of the polar coordinates is made much larger than the specified theta motion to limit the required theta angle and clearance between coil 14a and 15a to their field magnets 14b and 15b, respectively, such that there is no contact required during theta and radius polar motions.

Figure 2:
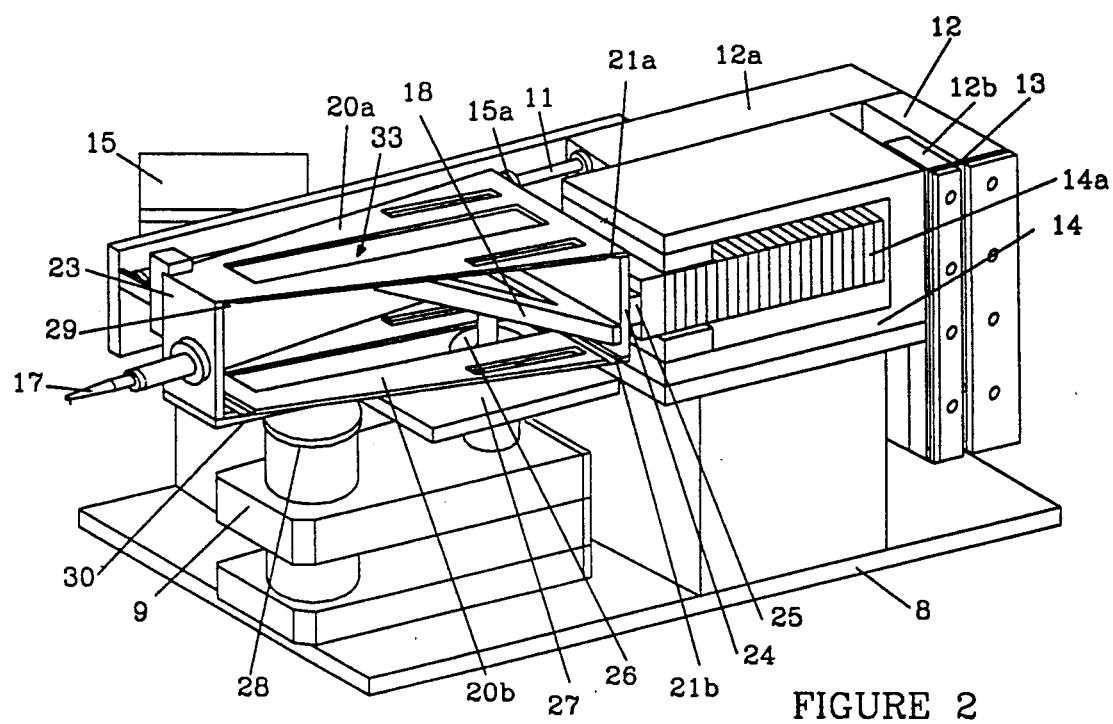
FIG. 2 is an isometric illustration of a parallel flex arm bond head mounted on the polar table with a fixed Z-axis drive motor.

FIG. 2 is an isometric illustration of a parallel flex arm bond head assembly 33 mounted on a polar table with a fixed Z-axis voice coil drive motor. Bond head assembly 33 is mounted to the table rod 10 (FIG. 3) by back plate 24 (FIG. 4), which is driven in polar coordinates by radius polar linear motor 14 and theta polar linear motor 15. Parallel arms 20a and 20b, allow bond head face plate 23 to move in the Z-axis through an arc described by the length of the parallel arms 20a, 20b with bond head face plate 23 maintained parallel to the rear mounting plate 24. Ultrasonic horn 17 is mounted to bond head face 23 and moves in the same Z motion with its Z-axis always parallel to rear mounting plate 24. Plate 18 is attached to and moves with bond head assembly 33, and is part of the bond head moving support mechanism, 26 and 27, which keeps the rear mounting plate 24 square to the motion of the bond head assembly 33.

Bond head face plate 23 is driven in the Z-axis by motor assembly 9 and 28, through bottom interface plate 19 (FIG. 3) which provides a planar coupling to the moving bond head interface plate 30. Z-axis sensor. $S_3$ (FIG. 4) monitors position for feed back to electronic motor control.

Figure 3:
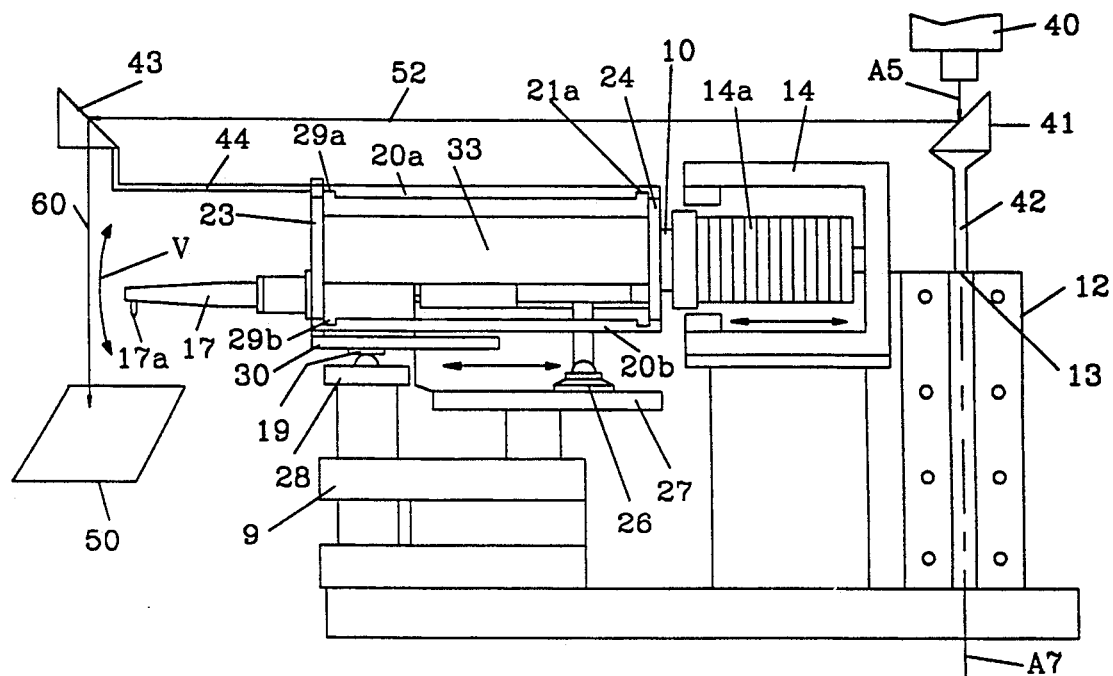
FIG. 3 is a side view of the parallel flex arm bond head mounted on the polar table with a fixed Z-axis drive motor and a stationary vision function camera and system.

FIG. 3 is a side view of the parallel flex arm bond head mounted on the polar table with a fixed Z-axis drive motor 19 and stationary vision function camera 40. Bond head assembly 33 is mounted to the polar coordinate table by back plate 24. Parallel arms 20a and 20b connect bond head face 23 to back plate 24. Reduced areas 21a, 21b and 29a, 29b, provide a pivoting action, allowing bond head face plate 23 to move through arc V for bond head Z-axis motion. Parallel arms 20a and 20b keep the bond head face plate 23 parallel to back plate 24, eliminating rocking motion of a single pivot bond head system. Parallel Z motion of bond head face plate 23 to bond head back plate 24 allows the bond head and ultrasonic horn 17 to remain square to the materials being bonded regardless of material bond height.

Stationary Z-axis motor 9 uses output shaft 28 to control the position of bond head face 23 through a planar coupling interface 19 and moving bond head interface plate 30.

Vision function camera 40 is mounted so its optical centerline A5 is on the vertical theta motion centerline A7 of the polar table. A 45 degree mirror 41 is also mounted on theta rotation centerline A7 (FIG. 3), but rotates with the theta motion of the polar table and is aimed at a second 45 degree mirror 43. Mirror 43 is located in front of bonding tool 17a, mounted to bond head plate 23, and moves with all polar coordinates. This optical path, (A5, 52 and 60), allows the camera to see all polar positions with the image staying on the camera centerline. Lens and other optical components are added to the optical path as required for correction vision pictures.

The vision camera can be mounted of centerline A5 and a third mirror/prism (not illustrated) can be used to reflect the field of view into the camera lens.

Figure 3A:
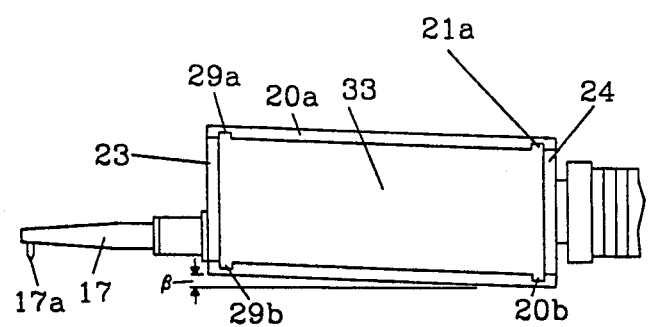
FIG. 3a is a partial view of the bond head illustrating vertical motion of the bond head.

FIG. 3a illustrates the vertical motion of the bond head. Back plate 24 is attached to field magnet coil 14a by rod 10. As the flex head bond head assembly 33 is moved vertically, the arms 20a and 20b are flexed, at reduced areas 21a, 21b, 29a and 29b, such that face plate 23 remains parallel to back plate 24. As illustrated, the bond head assembly 33 is move through angle $\beta$.

Figure 4:
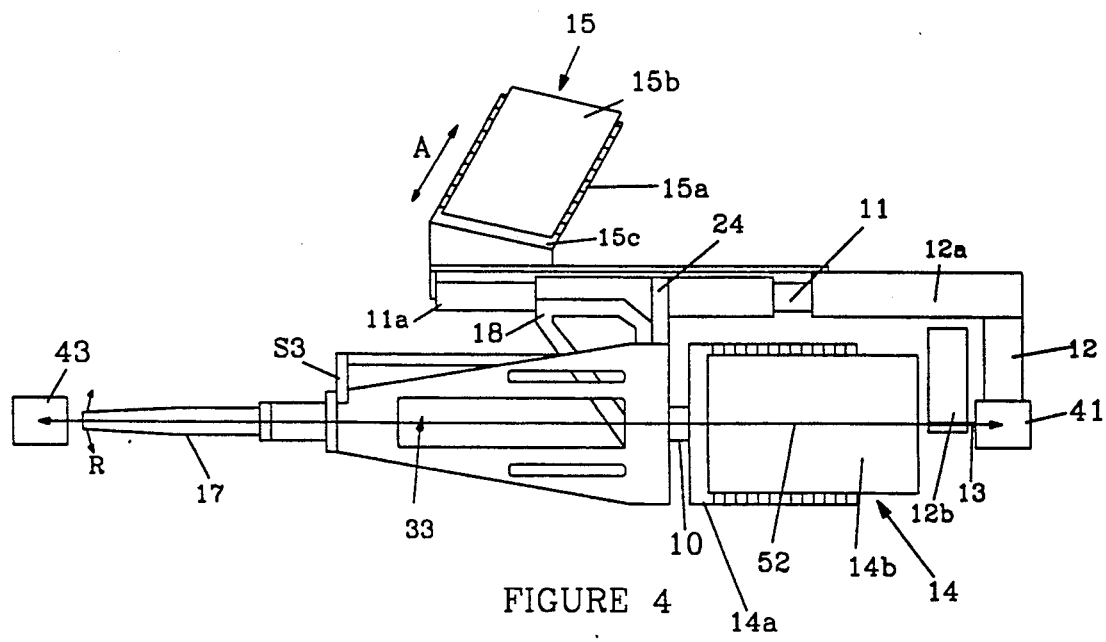
FIG. 4 is a top view of the bonder of FIG. 3.

FIG. 4 is a top view of the parallel flex arm bond head mounted on the polar table. Radius motor field magnet 14b, theta motor field magnet 15b, and theta flex mount 12b are all fixed and to not move relative to one another. Theta rod 11 is attached to theta motor coil 15a and theta pivot 13 by moving parts 12, 12a and 11a. Current flow in the theta motor 15 causes the coil 15a to move in or out of theta motor filed magnet 15 as indicated by arc A, The pivot or angular motion theta is centered about flex pivot 13. This angular or arc motion provides the theta portion of traditional polar coordinate motion. Polar table 33 slides up and down theta rod 11 and is attached to radius motor coil 14a. Current flow in radius motor coil 14a causes the coil to move in and out on centerline of theta rod 11. This motion provides the radius portion of traditional polar coordinate motion.

The radius dimension of the polar coordinates is made much larger than the specified theta angular motion to limit the required theta angle, and clearances between coil 14a and 15a to their field magnets 14b and 15b, respectively, such that there is no contact during required theta and radius polar motions.

What is claimed:

1. A bonder with a polar motion bond head for bonding semiconductor devices, comprising:
   a bond head frame assembly including a bond head secured to a mounting frame on which the bond head frame assembly is mounted, and a pivot mount attached to the mounting frame, wherein the bond head frame assembly and mounting frame are movable in an arc about the pivot mount;
   a second voice coil motor for moving the bond head in a linear motion;
   a first voice coil motor for moving the bond head and second voice coil motor in an arc in a horizontal plane;
   a third voice coil motor for moving the bond head in a vertical direction; and
   an optical viewing system mounted on the mounting frame;
   wherein the bond head is positioned over a location on a semiconductor using polar movement.

2. The bonder according to claim 1 including a first sensor for determining the degree of motion produced by said first voice coil motor.

3. The bonder according to claim 1 including a second sensor for determining the distance moved by the bond head as a result of movement caused by said second voice coil motor.

4. The bonder according to claim 1, including a slide bearing on which the bond head and the mounting frame moves in a linear motion.

5. The bonder according to claim 1, including a vision system having a camera mounted in a fixed non-movable position.

6. The bonder according to claim 1, wherein said mounting frame to which the bond head is attached is a flexible frame movable in a vertical direction by said third voice coil motor.

7. The bonder according to claim 6, where said mounting frame includes top and bottom plates and two end plates connected to the top and bottom plates, the mounting frame is flexible at reduced thickness areas on the top and bottom plates.

8. The bonder according to claim 7, wherein the two end plates remain parallel to each other as the mounting frame is flexed vertically.

9. The bonder according to claim 8, including:
   an optical viewing system secured to the mounting frame such that the viewing system tracks the bond head motion as the bond head moves in a linear or angular motion.

10. The bonder according to claim 1, wherein said pivot mount attached to the mounting frame is a flexible steel plate.

11. A bonder with a polar motion bond head for bonding semiconductor devices, comprising:
a bond frame assembly including a bond head secured to a movable frame;
a second voice coil motor for moving the bond head in a linear motion;
a first voice coil motor for moving the bond head and second voice coil motor in an arc in a horizontal plane;
a third voice coil motor for moving the bond head in a vertical direction;
a mounting frame on which the bond head frame assembly is mounted, and a pivot mount attached to the mounting frame, wherein the bond head frame assembly and mounting frame is movable in an arc about the pivot mount;
a first mirror/prism mounted on the pivot mount;
a second mirror/prism attached to the bond head and positioned over the bonder bond area;
and a vision camera position over the first mirror/prism such that the camera viewing field is reflected through the two mirror/prisms to the bonder bond area.

12. The bonder according to claim 11, wherein the first mirror/prism rotates with the frame assembly about the pivot mount, and the second mirror/prism tracks the motion of the bond head.

13. The bonder according to claim 11, including a third mirror/prism for reflecting the viewing field from the first mirror/prism to the vision camera.

14. A bonder with a polar motion bond head for bonding semiconductor devices, comprising:
a bond head;
a bond head frame assembly including the bond head secured to a mounting frame on which the bond head frame assembly is mounted, and a pivot mount attached to the mounting frame, wherein the bond head frame assembly and mounting frame are movable in an arc about the pivot mount;
a second voice coil motor for moving the bond head in a linear motion in a direction R;
a first voice coil motor for moving the bond head and said second voice coil motor through an angle theta in a horizontal plane; and
a third voice coil motor for moving the bond head in a vertical direction;
wherein the bond head is positioned over a location on a semiconductor using polar motion where, in rectangular coordinates X and Y, X=(R+Delta R) Cosine theta and Y=(R+Delta R) Tangent theta.

15. A polar motion table apparatus, including:
a mounting frame, including a bond head frame assembly, and a pivot mount attached to the mounting frame, wherein the bond head frame assembly and mounting frame are movable in an arc about the pivot mount;
a second voice coil motor for moving the mounting frame in a linear motion in a direction R;
a first voice coil motor for moving the mounting frame and second voice coil motor through an angle theta in a horizontal plane; and
wherein polar motion of the polar motion table is defined by the angle theta and linear motion R referenced to the pivot mount.

16. The polar motion table according to claim 15, including a third voice coil motor for moving the mounting frame in a vertical direction.

17. The polar motion table according to claim 15, wherein each voice coil motor includes a magnet, and the magnet is stationary with respect to the mounting frame.

18. The polar motion table according to claim 15, wherein the mounting frame is a frame, flexible in a vertical direction.

19. The polar motion table according to claim 18, including front and back plates parallel to each other on said mounting frame, said front and back plates remaining parallel to each other when the mounting frame is flexed in a vertical direction.

20. The polar motion table according to claim 18, wherein a bonding tool is mounted on said mounting frame parallel to said flat work surface, wherein said bonding tool remains parallel to said flat work surface when said mounting frame is moved in a vertical direction.

21. The polar motion table according to claim 15, wherein the angle theta motion and the linear motion R is produced by voice coil motors utilizing a bearing system, and the table and motors utilize a common bearing system.

22. The polar motion table according to claim 15, including a fixed vision system mounted independent of the polar motion table.

23. A polar motion bond head for bonding semiconductor devices, comprising:
a bond head secured to a movable, flexible frame;
a two axis table on which the movable, flexible frame is mounted; and
a voice coil motor moving the flexible frame in a vertical direction, wherein the flexible frame and voice coil motor are in sliding contact with each other.

24. The bonder according to claim 23, including a bonding work area, wherein the flexible frame has parallel arms that maintains the bond head perpendicular to the work area.

25. The bonder according to claim 23, including a plurality of voice coil motors for moving the flexible frame and two axis table, wherein the voice coil motors are fixed with respect to the bond table.

* * * * *